United States Patent
Haaf et al.

(10) Patent No.: US 9,357,663 B2
(45) Date of Patent: May 31, 2016

(54) ELECTRONIC UNIT OF A FLUID SENSOR OR VALVE AND FLUID SENSOR OR FLUID VALVE UNIT

(71) Applicant: Buerkert Werke GmbH, Ingelfingen (DE)

(72) Inventors: Volker Haaf, Frankenhardt (DE); Volker Ruff, Rot am See (DE); Christopher Christie, Kuenzelsau (DE)

(73) Assignee: Buerkert Werke GmbH, Ingelfingen (DE)

( * ) Notice: Subject to any disclaimer, the term of this patent is extended or adjusted under 35 U.S.C. 154(b) by 0 days.

(21) Appl. No.: 14/675,110

(22) Filed: Mar. 31, 2015

(65) Prior Publication Data

US 2015/0289393 A1  Oct. 8, 2015

(30) Foreign Application Priority Data

Apr. 2, 2014  (DE) ..................... 20 2014 101 560 U

(51) Int. Cl.
| | |
|---|---|
| *H05K 1/14* | (2006.01) |
| *H05K 5/00* | (2006.01) |
| *G01D 11/24* | (2006.01) |
| *H05K 5/02* | (2006.01) |
| *G01F 15/14* | (2006.01) |

(52) U.S. Cl.
CPC .............. *H05K 5/0065* (2013.01); *G01D 11/24* (2013.01); *H05K 5/0221* (2013.01); *H05K 5/0239* (2013.01); *H05K 5/0247* (2013.01); *G01F 15/14* (2013.01)

(58) Field of Classification Search
USPC .................. 361/742, 731–732, 758, 790, 770
See application file for complete search history.

(56) References Cited

U.S. PATENT DOCUMENTS

| | | | | | |
|---|---|---|---|---|---|
| 4,630,175 | A | * | 12/1986 | Lerude ................. | H05K 7/1435 174/541 |
| 5,335,144 | A | * | 8/1994 | Maroushek ........ | H05K 7/20136 165/122 |
| 6,351,383 | B1 | * | 2/2002 | Payton .................... | F42B 15/08 165/80.3 |
| 6,839,238 | B2 | * | 1/2005 | Derr ..................... | H05K 5/0021 361/728 |

(Continued)

FOREIGN PATENT DOCUMENTS

| | | |
|---|---|---|
| DE | 60 2004 002 556 T2 | 1/2007 |
| DE | 60 2004 011 740 T2 | 2/2009 |

(Continued)

OTHER PUBLICATIONS

Search Report for DE 20 2014 101 560.4 (mailed Mar. 25, 2015).

*Primary Examiner* — Hung S Bui
(74) *Attorney, Agent, or Firm* — Klarquist Sparkman, LLP

(57) ABSTRACT

An electronic unit of a fluid sensor or fluid valve has a substantially cylindrical housing with a longitudinal axis and an open end face, which can be closed by a lid, several spacers formed as separate parts, which can be introduced into the housing in direction of the longitudinal axis and are directly stacked on top of each other. At least one spacer at least one electronic component is attached, which together with the spacer forms a premounted unit to be introduced into the housing.

16 Claims, 4 Drawing Sheets

(56) References Cited

U.S. PATENT DOCUMENTS

| | | | |
|---|---|---|---|
| 7,286,365 B2* | 10/2007 | Sarno | H01L 25/18 174/16.3 |
| 7,458,705 B2* | 12/2008 | Chiba | B60Q 1/2696 362/249.01 |
| 8,942,005 B2* | 1/2015 | Geswender | F42B 15/08 361/792 |
| 2005/0235747 A1* | 10/2005 | Benson | G01F 15/18 73/238 |
| 2008/0190493 A1* | 8/2008 | Oh | G01L 19/0038 137/554 |
| 2012/0007229 A1 | 1/2012 | Bartley et al. | |
| 2013/0285242 A1 | 10/2013 | Watts et al. | |
| 2015/0260662 A1* | 9/2015 | Edward | G01N 252/04 73/579 |

FOREIGN PATENT DOCUMENTS

| | | |
|---|---|---|
| DE | 20 2012 103 024 U1 | 1/2013 |
| DE | 11 2011 102 298 T5 | 4/2013 |
| DE | 21 2011 100 153 U1 | 7/2013 |
| DE | 11 2011 105 977 T5 | 12/2014 |
| EP | 1544806 | 2/2006 |
| EP | 1574791 | 9/2006 |
| WO | WO2012/050464 | 4/2012 |

* cited by examiner

ELECTRONIC UNIT OF A FLUID SENSOR OR VALVE AND FLUID SENSOR OR FLUID VALVE UNIT

CROSS REFERENCE TO RELATED APPLICATION

The present application claims priority from pending German Patent Application No. 20 2014 101 560.4, filed Apr. 2, 2014, which is incorporated herein by reference.

FIELD

The present invention relates to an electronic unit of a fluid sensor or fluid valve, with a substantially cylindrical housing with a longitudinal axis and an open end face which can be closed by a lid. Furthermore, the invention relates to a fluid sensor or fluid valve unit.

BACKGROUND

Such electronic units also are referred to as control heads for fluid sensors or fluid valves. In these electronic units, electronic components in the form of circuit boards are arranged.

If possible, these electronic units should be used for various fluid sensors and fluid valves with different properties and expansion stages, in order to keep the construction effort as low as possible.

Correspondingly, it is the object of the present invention to create an electronic unit which is constructed as simple as possible and is universally usable.

SUMMARY

The present invention provides an electronic unit of one of a fluid sensor and fluid valve, the electronic unit comprising a substantially cylindrical housing with a longitudinal axis and an open end face, which can be closed by a lid, several spacers formed as separate parts, which can introduced into the housing in direction of the longitudinal axis and which are directly stacked on top of each other, wherein to at least one spacer at least one electronic component is attached, the at least one electronic component together with the spacer forms a premounted unit to be introduced into the housing.

The electronic unit according to the invention has a kind of modular system, in that several separate spacers are used and electronic components individually are arranged on these spacers. Thus, depending on the equipment variant and depending on the performance or requirement of the fluid sensor or fluid valve, a corresponding stack of spacers with or without electronic component or correspondingly designed electronic components can be assembled. Above all, it is possible that spacers fulfill various functions. More exactly, this means that the electronic components of these spacers realize various functions or equipment variants. Depending on the customer's wish, a control head with the corresponding functions then can quickly be assembled. In addition, a control head also can be retrofitted in that for example a spacer without electronic component is replaced by a corresponding spacer with the electronic component having the desired function.

For easier stacking, the spacers have the same contour as seen in the longitudinal axis.

The spacers can have latching hooks which engage counter-contours on the adjacent spacer, in order to form a positive connection acting in the longitudinal axis. Due to this positive connection it is possible to assemble the spacers to a stable stack, at least before insertion into the housing. This simplifies the handling of the spacers and of the premounted stack and also facilitates the insertion and removal of the stack into and out of the housing.

The spacers for example are formed as circumferential rings.

The latching hooks can axially protrude from only one axial edge of the spacer and on the opposite edge of the spacer the same can have a corresponding recess with an undercut for the hooks to snap into place. It thereby is ensured that the spacers always are stacked on top of each other with the correct side, so that a kind of indexing becomes possible.

In their radial interior, the spacers can carry the electronic component.

The spacer preferably is made in one piece and is a cast part, in particular a cast plastic part.

The spacers also sit on each other at the axial circumferential ends of the edges, so that the electronic components of adjacent spacers are spaced from each other and thus a space is created for accommodating the electronic components.

For reducing the assembly effort in an electrical sense, electrical contacts might be mounted on the spacers, which touch the counter-contacts of the adjoining spacers, in order to electrically couple the adjacent spacers with each other. Preferably, contacts and counter-contacts are designed in the form of pins and female sockets. By contacts and counter-contacts, the electrical contact also is made automatically by plugging the spacers into each other or stacking them on top of each other. This allows to avoid a corresponding cabling or at least to reduce the cabling effort.

For better retention and for easier plug-in of the contacts into the counter-contacts, guide elements can be present at the spacers for aligning and/or securing the position of pins which form the contacts. An example for the formation of such guide elements consists in that a wall with openings through which the pins extend is formed, which in turn is a portion of the spacer, i.e., an integral part of the spacer.

These guide elements in particular are provided for those pins which protrude on the own circuit board of the spacer. The oblong pins thereby are stabilized and are aligned exactly when mounting the circuit board on the spacer.

It is, however, also possible that at least one spacer has a lateral electric plug connection to which an electric plug with cable can be plugged. Via this electric plug connection, the stack for example can electrically be coupled with the valve and/or with the lid and the electric components provided there.

In the present invention, the spacers with electronic component preferably are connected with each other without cables, i.e., only with protruding contacts and counter-contacts. Cables e.g., are exclusively laid from the electronic component of a spacer, which is located nearest to the sensor or to the valve, to the sensor or valve. A further option for the use of a cable is the connection to the surroundings through an opening of the housing and/or the connection to a display from the nearest electronic component, in particular from the spacer with electronic component which is nearest to the lid.

Since preferably on the open end face an indicating element, either a lamp or a display, always is provided, the stack with spacers is built up from the open end face in the electronic unit according to the invention. This means that those spacers which carry electronic components are located at the end of the stack which is near to the open end face, whereas spacers possibly designed without electronic components come to lie at the opposite end of the stack.

Then, the aforementioned electrical contacts as well as the counter-contacts can also be mounted on the electronic component. This means that the spacer in its simplest form is a ring without any electronic components or electronic contacts. Depending on the equipment variant, this ring can then be equipped with different electronic components.

Spacers without any electrical contacts must be bridged for the electronic connection, which can be effected via a cable. Alternatively, there can be spacers which in their simplest embodiment include the electrical contacts, so that by the same bridging of the signal or more generally a flow of current is possible.

The spacers sectionally can have an edge retracted to the inside, so that between the spacers and the inside of the housing there is room for the lateral connection of a cable laterally at the stack of spacers.

To the open end face of the housing a lid can be attachable, which closes the end face and which is electrically coupled with the electronic component on the directly adjoining spacer, in particular via a cable or via a plug connection. In the lid, indications in the form of a display or lamps can be actuated, for example.

The lid likewise preferably includes an electronic component, in particular this can be a display, a SIM card holder with SIM card contacts and/or a lamp.

For the optimum alignment of the spacers, in particular for centering the spacers to each other, the spacers can have guiding contours which engage into each other. It is possible, for example, that an edge of the spacer has a shoulder which engages into a corresponding depression on the opposite side of the edge of the adjacent spacer.

Beside the open end face the housing furthermore can have a lateral opening, wherein the opening geometries of these openings are the same, so that the same lid can be put on both openings, in order to close the same. This embodiment is particularly universal, as the lid with display can close both the end face and the opening on the side face, depending on the mounting position of the control head. Contacting of the lid always is possible via the stack of spacers, for example in that a cable plug connection on a spacer allows putting on a lid, regardless of whether the same is mounted on the end face or on the lateral opening.

The premounted stack of spacers preferably is pretensioned in the housing via screws.

The screws can directly be turned into the housing or into a part firmly mounted on the housing. The part mounted on the housing in particular can be a part of a bayonet closure, a so-called bayonet ring. This has the advantage that this bayonet ring has a dual function, as it not only serves for retaining the screws, but also for fixing the housing at an adjoining part. This adjoining part in particular is the sensor or valve housing or an actuator unit.

One embodiment of the invention provides that in the housing at least one spacer without electronic component is provided for creating a placeholder. Preferably, always the same number of spacers are used for completely fitting the interior space of the housing. Depending on how many spacers are provided with electronic components, the number of spacers merely serving as placeholders and possibly for bridging contacts then is obtained. These spaceholder disks solely serve for the stack to always have the same size, in order to always have the identical mounting situation.

The electronic components in particular are electronic modules, which can easily be combined with each other. For example, a transmitter circuit board can be provided for the transmission and evaluation of sensor data, an actuator driving circuit board for connection to a valve, gateways for the bus communication in various embodiments for example for Ethernet, Profinet or Modbus, a 230 V power supply unit, I/O modules or a relay module, wherein on the one hand one of these corresponding electronic modules can be provided on one spacer each or several of these modules together can be provided on one spacer.

The invention in addition relates to a fluid sensor or fluid valve unit, with a fluid sensor or a fluid valve and an electronic unit according to the invention which is put onto the fluid sensor or the fluid valve, wherein the electronic unit forms the sensor or valve controller.

In particular, the separate housings of fluid sensor or fluid valve on the one hand and the electronic unit on the other hand are attached to each other. However, this is not to be understood in a limiting sense.

DETAILED DESCRIPTION

Figure 1:
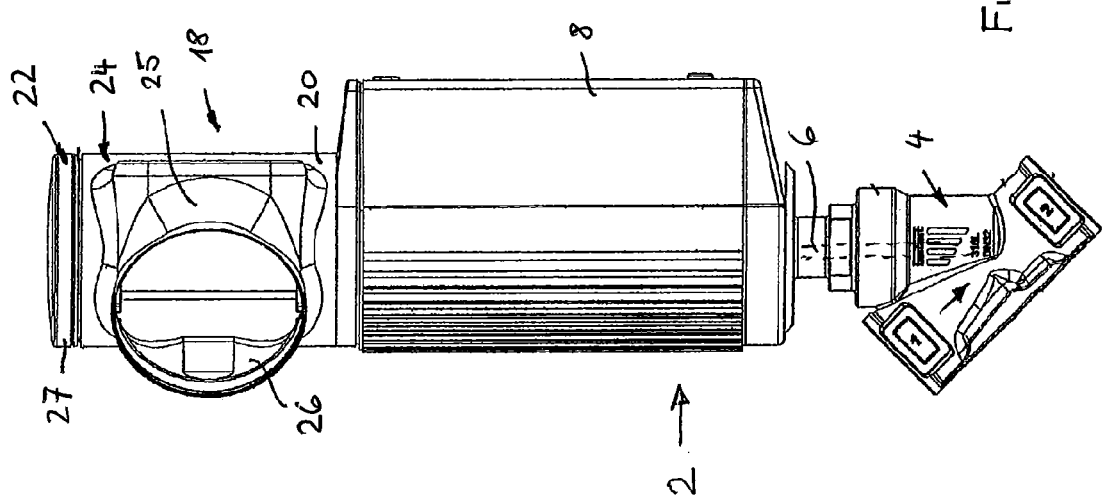
FIG. 1 shows a side view of a fluid valve unit according to the invention with the electronic unit according to the invention.

FIG. 1 shows a fluid valve unit, comprising a fluid valve 2 which includes a valve housing 4 which is fluid-traversed in direction of arrow, as well as an electrically, hydraulically or pneumatically actuatable valve tappet 6 and an actuator unit 8. In the actuator unit 8, the actuating force for the valve tappet 6 is applied.

Onto the actuator unit 8 an electronic unit 18 is put, which preferably has its own housing 20. The electronic unit 18 also is referred to as control head and contains the electronics necessary for the control, regulation and measuring electronics of the valve including the actuator unit 8.

The substantially cylindrical housing 20 of the electronic unit 18 has an upwardly open end face 22 as well as an outer jacket 24 which has a bulge 25 with a lateral opening 26. The lateral opening 26 preferably has the same opening geometry as the open end face 22, so that both the lateral opening and the open end face 26, 22 can be closed by identically constructed lids 27.

The corresponding lid 27 can be formed in two parts, with an internal lid part and a display attached thereto. Depending on the type of installation and the customer's wish, the display thus can be positioned at the side or on the upper end face. In any case, both openings in the housing 20 are closed. In FIG. 1, the housing 20 is shown still open at the side.

Figure 2:
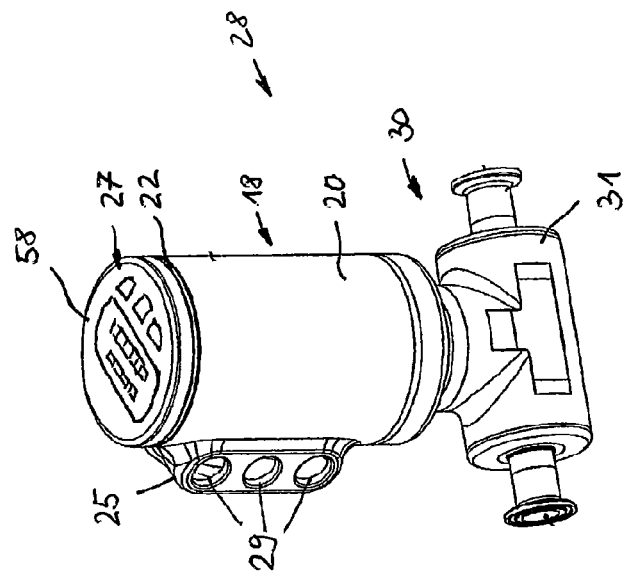
FIG. 2 shows a side view of a fluid sensor unit according to the invention likewise with an electronic unit according to the invention.

In FIG. 2 the corresponding, identically constructed electronic unit 18 likewise in the form of a control head is part of a fluid sensor unit 28, which has a fluid sensor 30 which is provided with its own outer housing 31 and onto which the electronic unit 18 is put for its control or for the corresponding measurement of the fluid. The fluid sensor for example can be a flow sensor, an analytical sensor or a mass flow sensor or the like.

FIG. 2 shows lateral connection openings 29 for electric, hydraulic and/or pneumatic units which could not be seen in FIG. 1.

In the following Figures, the electronic unit 18 is shown in greater detail.

The electronic unit 18 comprises a substantially cylindrical outer housing 20, in whose jacket region a bulge 25 optionally shown in FIGS. 1 and 2 is formed, which then is provided with the lateral opening 26. Outside the bulge, the housing 20 is substantially cylindrical.

In the interior of the housing 20 the electronic unit for the fluid sensor or the fluid valve is accommodated. The electronic unit is formed by electronic components 32 to 36 in the form of circuit boards.

The circuit boards form electronic modules and each are individually adapted to corresponding tasks and functions, in order to provide different expansion stages of the electronic unit, which can be combined with each other as desired. For example, a transmitter circuit board for the transmission and evaluation of sensor data, an actuator driving circuit board for connection to a valve, gateways for the bus communication in various embodiments for example for Ethernet, Profinet or Modbus, a 230 V power supply unit, I/O modules or a relay module each can be designed individually on a single circuit board for each of these units. Alternatively, several of the above units can be accommodated on one circuit board.

The stacked circuit boards 34 and 36 each are held and positioned in a spacer 38 and 40.

The spacers are injection-molded plastic parts and preferably rings continuous in circumferential direction.

Figure 6:
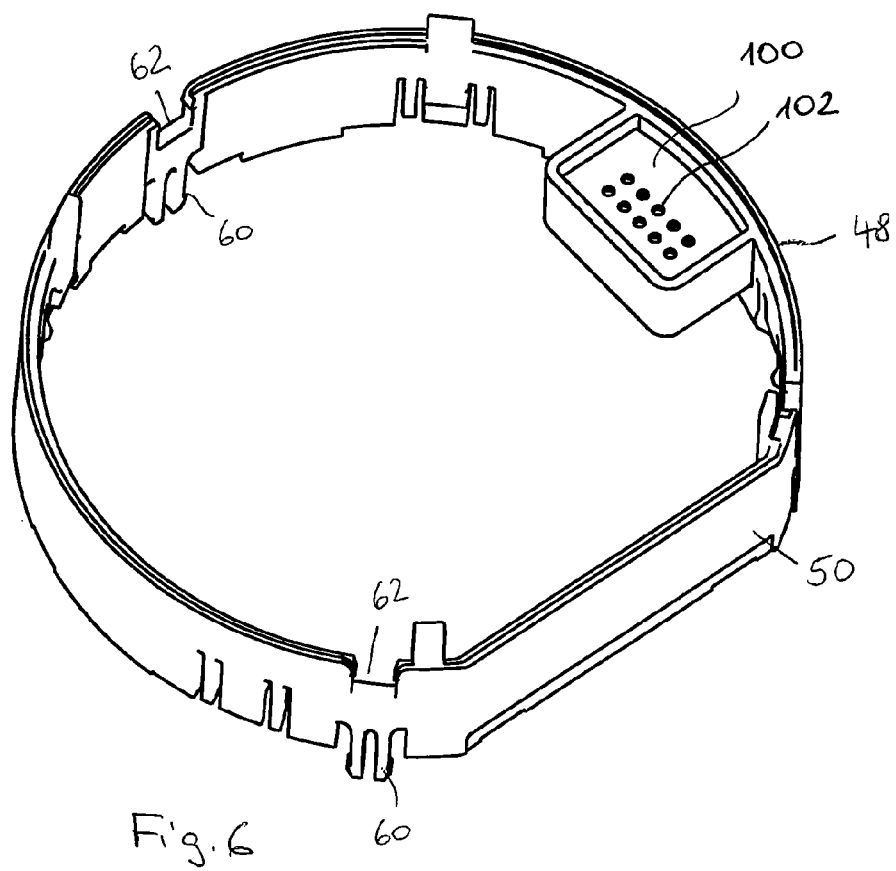
FIG. 6 shows a perspective top view of a spacer according to FIG. 5.

As shown in FIG. 6, the structure of the spacers 38 to 46 substantially is determined by a strip-like form, wherein the strip does not extend flat for forming the ring, but upright and hence in axial direction, so that a kind of cylinder portion is obtained.

Each spacer 38 to 46 has a circular ring-shaped portion 48 and a retracted portion 50, which in the present case is designed as flat portion.

Figure 7:
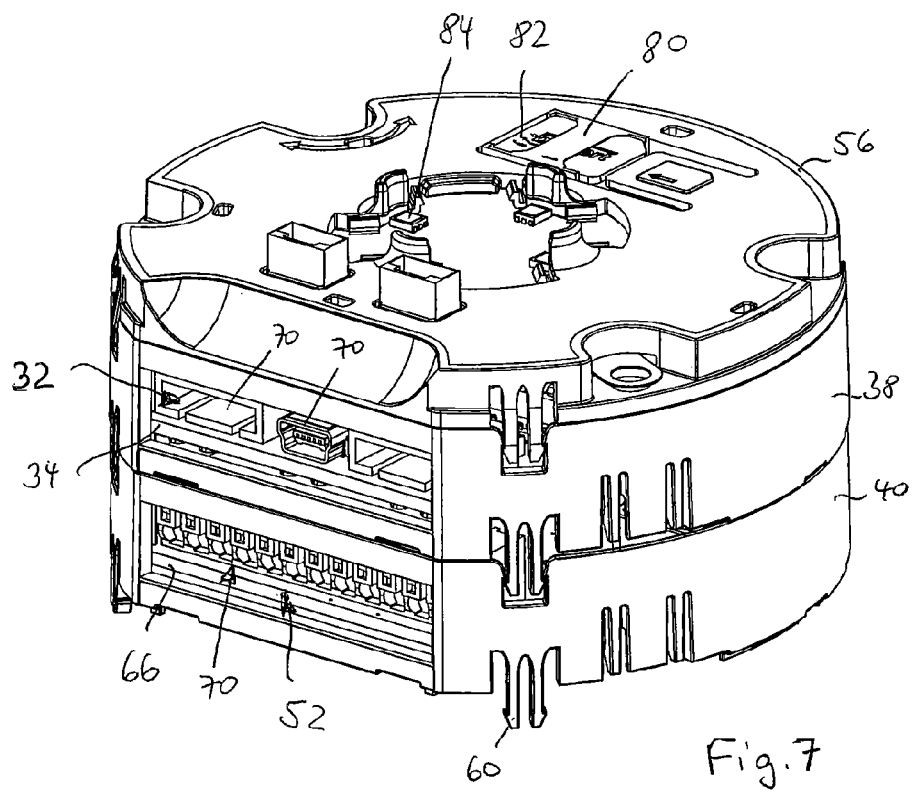
FIG. 7 shows a perspective view of the two uppermost spacers according to FIG. 3 along with lid underpart.

The spacers substantially have the same shape, in particular in a top view (longitudinal direction) the same contour. They can partly or completely be designed as identical parts. In contrast to the holders 42 to 46, however, the holders 38, 40 do not include the completely continuous flat portion 50, but the portion 50 rather is provided with an opening window 52 which, as shown in FIG. 7, serves as access to electric plug connections 70. These connections 70 are contacted by cables which are guided to the outside via the connection openings 29.

Figure 3:
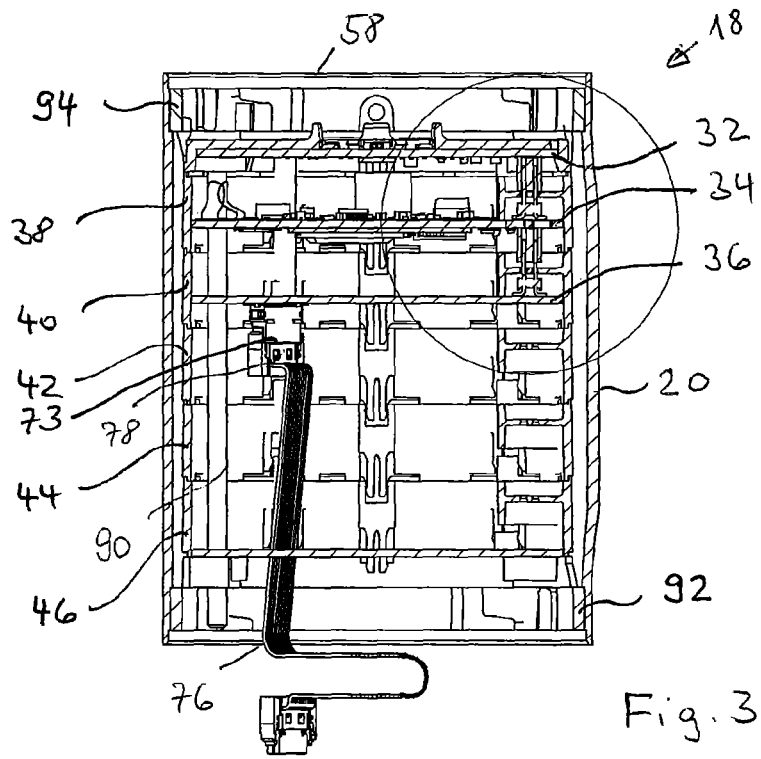
FIG. 3 shows a longitudinal sectional view through the electronic unit according to the invention as shown in FIGS. 1 and 2.

In addition to the spacers, there is also provided a bottom 54 as well as a two-part lid 27 with a lid underpart 56 and a display 58 put onto the lid underpart 56 (see FIGS. 2 and 3). The lid underpart 56 carries a circuit board 32.

Figure 5:
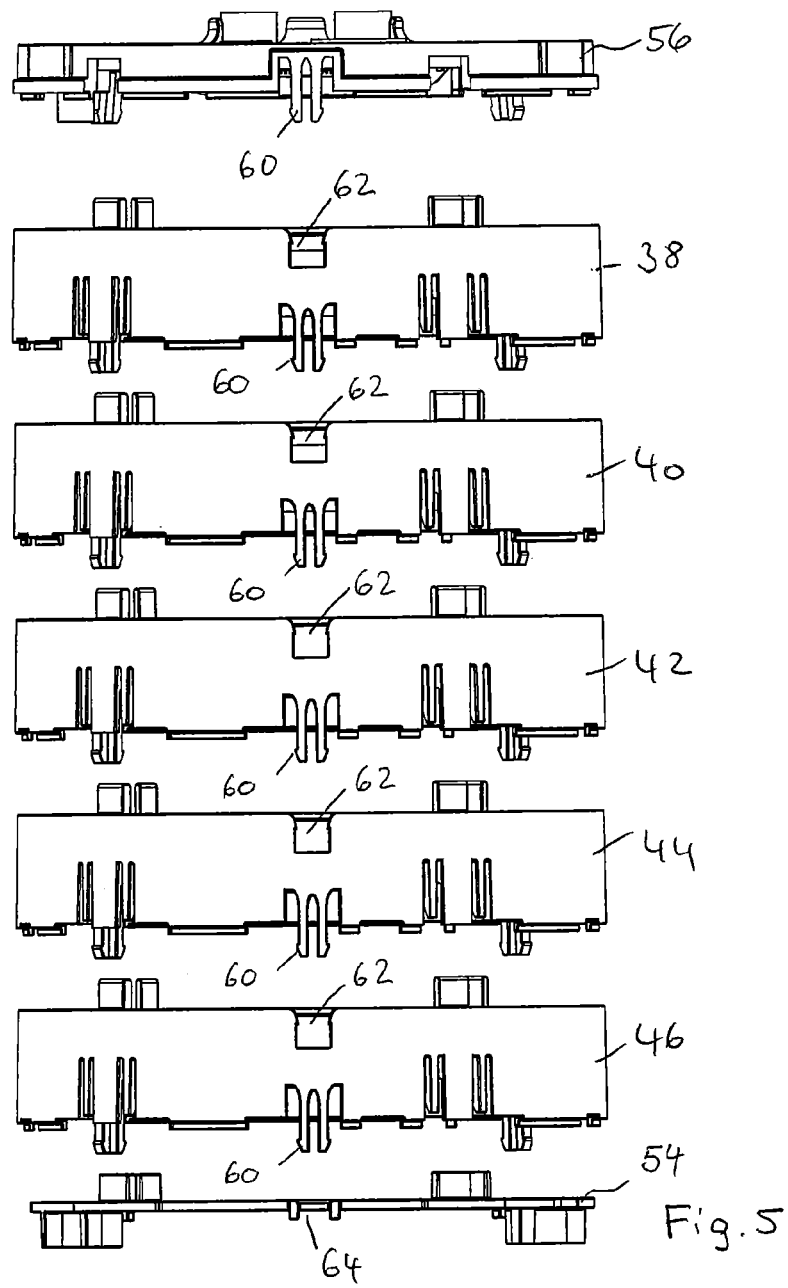
FIG. 5 shows an exploded view of the individual spacers along with lid underpart and bottom, which are incorporated in the electronic unit according to the invention as shown in FIG. 3.

The spacers 38 to 46 have integrally molded latching hooks 60 (see FIG. 5), which all protrude from the same side of the edge, here the underside. At the opposite edge, in the same alignment with the latching hooks 60, each spacer 38 to 46 includes a corresponding recess 62 with an undercut, so that the spacers can be snapped into each other and thus form a premounted stack.

The bottom 54 also has a recess 64 for each latching hook 60 of the spacer 46.

The lid underpart 56 likewise has latching hooks 60. As shown in FIGS. 3 and 7, the latching hooks 60 of all parts extend in alignment.

Figure 4:
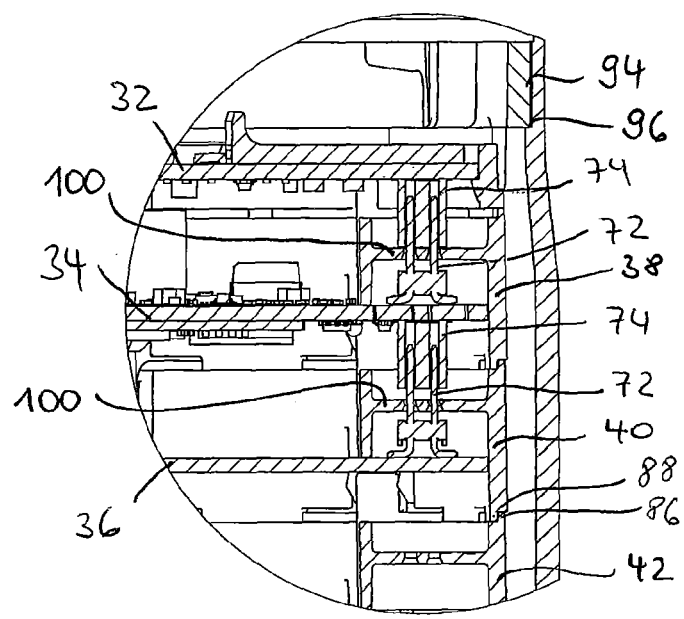
FIG. 4 shows an enlarged view of the portion of the electronic unit encircled in FIG. 3.

Radially in their interior, the spacers 38 and 40 each carry an electronic component in the form of one or more circuit boards 34 and 36, as is shown in FIGS. 3, 4 and 7.

On the circuit boards 32 to 36, there can also be mounted laterally accessible plug connections 70 which are shown in FIG. 7.

In addition, the circuit boards 32 to 36 carry electrical contacts in the form of pins 72 always protruding on the same axial side (see FIG. 4) and on the opposite side of the circuit boards 32 to 36 counter-contacts in the form of sockets 74 for receiving the pins 72 on the adjacent spacer.

When the spacers 38 to 46 as well as bottom 54 and lid underpart 56 are stacked on top of each other, the latching hooks 60 ensure a circumferential alignment of the spacers 38 to 42.

The lid underpart 56 also has corresponding pins or sockets 72, 74, so that it is also electrically contacted with the circuit boards 32 to 36.

Such electrical contacts also might be provided in the spacers 42 to 46 not provided with circuit boards 32 to 36, but for simplifying or reducing the costs of these empty parts exclusively acting as spacers they do not carry any electrical components and no contacts.

In FIG. 6 it can be seen that a wall 100 integrally protrudes from the spacer to the inside, which is provided with several openings 102. This wall 100 including openings 102 serves as guide element for the contacts, here for the pins 72. The pins 72 extend upwards from below through the openings 102, as is also shown in FIG. 4. The pins 72 of the circuit boards 34 and 36 hence are aligned and guided exactly, when the boards are mounted on the corresponding spacer 38, 40.

However, to allow the contact between the circuit boards 32 to 36 and the valve or the sensor and/or lid 27, a cable 76 with plug 78, see FIG. 3, is put into an electrical plug connection 73 and guided downwards in the interior of the spacers 44, 46. It is likewise possible to guide cables from one or more circuit boards 32 to 36 upwards to the lid underpart 56 or right to the display 58, if this is necessary.

When the display 58 is mounted laterally and is meant to close the opening 26, it likewise is recommendable here to couple the display 58 with the corresponding circuit board 32 to 36 via a cable.

The attachment of the circuit boards 32 to 36 to the lid underpart 56 and to the corresponding spacers 38 and 40 for example can be effected by gluing, and on its inside (not shown) the spacer 38 and 40 likewise can have a shoulder set off to the inside (here: underside of the edge of the wall 100) or also a latching connection for the circuit board.

On the upper side of its circuit board 32 the lid underpart 56 has a SIM card holder 80 with SIM card contacts 82, as well as possibly lamps 84, for example diodes.

The radial alignment of the spacers 38 to 46 to each other, possibly also the radial alignment of the lid underpart 56 and the bottom 54 to the adjoining spacer 38, 46 is effected via interlocking guiding contours, here interlocking shoulders and depressions 86, 88 at the lower and upper edges of the spacer.

Regardless of how many functions and hence how many electrical components are accommodated in the electronic unit, always the same number of spacers is stacked on top of each other, in order to completely fill the interior space. In this way, always the same position of the same electronic components can be secured in axial direction within the stack.

Since the stack is held within the housing 20 not only via the latching connections, but by means of several screws 90 (see FIG. 3), which brace the spacers 38 to 46 as well as the lid underpart 56 and the bottom 58 with each other, always the same screw length can be used with the same number of stacked parts.

For fixing, a bayonet ring 92 is provided at the lower end of the housing 20, which is attached to the housing 20 by pressing and/or gluing or the like. Via the bayonet ring 92, a bayonet closure is possible with the adjoining housing, i.e., the actuator unit 8 or the outer housing 31 of the fluid sensor.

The bayonet ring 92 has corresponding threaded openings, into which the screws 90 are turned.

A second bayonet ring 94 at the upper end of the stack, which is shown in FIGS. 3 and 4, is put onto the lid underpart 56 after insertion of the stack. The screws then extend through corresponding openings in the bayonet ring 94. On tightening of the screws, the bayonet ring 94 is urged against the stack, which is axially compressed until the bayonet ring 94 is pressed against a shoulder 96 (see FIG. 4) at the outer housing 20. This ensures an always constant position of the bayonet ring 94 in axial direction and a predefined pretensioning force of the stack.

The bayonet ring 94 likewise can be made of metal or plastics and ensures a bayonet closure with the lid, here the display 58.

The invention claimed is:

1. An electronic unit of one of a fluid sensor and fluid valve, the electronic unit comprising a substantially cylindrical housing with a longitudinal axis and a closable open end face, a plurality of spacers formed as separate parts, configured to be accepted into the housing in direction of the longitudinal axis and which are directly stacked on top of each other, wherein to at least one spacer at least one electronic component is attached, the at least one electronic component together with the spacer forming a premounted unit configured to be introduced into the housing, wherein at least one spacer forms a circumferential ring in which the region circumscribed carries the electronic component, and wherein the electronic component includes a circuit board forming a bottom of the premounted unit which contacts the ring.

2. The electronic unit according to claim 1, wherein, as seen in direction of the longitudinal axis, the spacers have the same contour.

3. The electronic unit according to claim 1, wherein the spacers have latching hooks which engage counter-contours at the adjacent spacers, forming a positive connection acting in the longitudinal axis.

4. The electronic unit according to claim 3, wherein the latching hooks and counter-contours are formed at an axial edge of its associated ring.

5. The electronic unit according to claim 1, wherein the spacers each are formed as circumferential rings.

6. The electronic unit according to claim 5, wherein the spacers sit on each other at their axial edges.

7. The electronic unit according to claim 1, wherein the circuit board fills the radial interior of the ring.

8. The electronic unit according to claim 1, further comprising on at least one spacer a lateral electrical plug connection configured to receive an electrical plug with a cable.

9. The electronic unit according to claim 8, wherein the spacers have an inwardly retracted portions in whose region the electrical plug connection is seated.

10. The electronic unit according to claim 1, wherein the housing has a lateral opening beside the open end face and the opening geometries of the open end face and the lateral opening are the same, such that the same lid can be put onto the end face or the opening.

11. The electronic unit according to claim 1, wherein the lid is electrically coupled with one of the electronic components.

12. The electronic unit according to claim 1, wherein at least one of the sensor, the valve and the lid is coupled via a cable with an electronic component on the spacer which spacer is located nearest to the corresponding one of the sensor, the valve and the lid, respectively.

13. The electronic unit according to claim 1, wherein the spacers form a premounted stack which is insertable into the housing.

14. An electronic unit of one of a fluid sensor and fluid valve, the electronic unit comprising a substantially cylindrical housing with a longitudinal axis and an open end face, closable with a lid, a plurality of spacers formed as separate parts introduced into the housing in a direction of the longitudinal axis and directly stacked on top of each other, wherein at least one electronic component is attached to at least one axially-open spacer, the at least one electronic component together with the spacer forming a premounted unit configured to be introduced into the housing, wherein on at least one spacer electrical contacts are mounted touching counter-contacts of adjoining spacers electrically coupling the electronic components with each other at different spacers, wherein the electronic unit further comprises guide elements at the spacers for at least one of aligning and securing the position of contact-forming, protruding pins, wherein at least one guide element is formed by a wall with openings through which the pins extend, and the wall protrudes radially inward from the spacer.

15. An electronic unit of one of a fluid sensor and fluid valve, the electronic unit comprising a substantially cylindrical housing with a longitudinal axis and an open end face, closable with a lid, a plurality of spacers forming separate parts that are configured to be accepted into the housing in a direction of the longitudinal axis and directly stacked on top of one another, wherein to at least one spacer at least one electronic component is attached, the at least one electronic component together with the spacer forming a premounted unit configured to be introduced into the housing, wherein in the housing at least some spacers without electronic components are provided, configured to create a spaceholder.

16. A fluid sensor or fluid valve unit with one of a fluid sensor and a fluid valve and an electronic unit put onto the fluid sensor and onto the fluid valve, respectively, wherein electronic unit comprises a substantially cylindrical housing with a longitudinal axis and an open end face configured to be closable with a lid, several spacers formed as separate parts, configured to be introduced into the housing in direction of the longitudinal axis and which are directly stacked on top of each other, wherein to at least one spacer at least one electronic component is attached, the at least one electronic component together with the spacer forms a premounted unit to be introduced into the housing, wherein the electronic unit forms a fluid sensor controller and a fluid valve controller, respectively.

\* \* \* \* \*